US007923923B2

(12) United States Patent
Cho et al.

(10) Patent No.: US 7,923,923 B2
(45) Date of Patent: Apr. 12, 2011

(54) ORGANIC LIGHT EMITTING DISPLAY DEVICE

(75) Inventors: Yoon-Hyeung Cho, Suwon-si (KR);
Jong-Hyuk Lee, Suwon-si (KR);
Min-Ho Oh, Suwon-si (KR);
Byoung-Duk Lee, Suwon-si (KR);
So-Young Lee, Suwon-si (KR);
Sun-Young Lee, Suwon-si (KR);
Won-Jong Kim, Suwon-si (KR);
Yong-Tak Kim, Suwon-si (KR);
Jin-Baek Choi, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 463 days.

(21) Appl. No.: 12/039,675

(22) Filed: Feb. 28, 2008

(65) Prior Publication Data

US 2008/0218064 A1  Sep. 11, 2008

(30) Foreign Application Priority Data

Mar. 2, 2007  (KR) .................. 10-2007-0021155

(51) Int. Cl.
*H05B 33/00* (2006.01)
(52) U.S. Cl. ........ 313/504; 313/506; 313/112; 313/113; 313/512
(58) Field of Classification Search .................. None
See application file for complete search history.

(56) References Cited

U.S. PATENT DOCUMENTS

| 7,646,146 B2 * | 1/2010 | Cok ............................ 313/506 |
| 2007/0108899 A1 * | 5/2007 | Jung et al. .................... 313/506 |
| 2008/0231175 A1 * | 9/2008 | Sung et al. ................... 313/504 |

FOREIGN PATENT DOCUMENTS

| JP | 07-201466 | 8/1995 |
| JP | 2002-373776 | 12/2002 |
| JP | 2003-162923 | 6/2003 |
| JP | 2003-203762 | 7/2003 |
| JP | 2005-275214 | 10/2005 |
| KR | 2002-0092973 | 12/2002 |
| KR | 10-2004-0000630 | 1/2004 |
| KR | 10-2005-0052289 | 6/2005 |

OTHER PUBLICATIONS

Japanese Office action dated Nov. 24, 2009, for corresponding Japanese application 2007-123849, noting listed references in this IDS.
Patent Abstracts of Japan, Publication No. 2003-162923, dated Jun. 6, 2003, in the name of Kenji Kono et al.
Korean Patent Abstracts, Publication No. 1020020092973 A, dated Dec. 12, 2002, in the name of Hirano Takashi.
Korean Patent Abstracts, Publication No. 1020040000630 A, dated Jan. 7, 2004, in the name of Yong Jung Choi et al.
Korean Patent Abstracts, Publication No. 1020050052289 A, dated Jun. 2, 2005, in the name of Hyun Eok Shin.

* cited by examiner

*Primary Examiner* — Ashok Patel
(74) *Attorney, Agent, or Firm* — Christie, Parker & Hale, LLP

(57) ABSTRACT

An organic light emitting display device including: a substrate; a sealing member; an organic light emitting device between the substrate and the sealing member and for displaying images; a selective light absorbing layer on a surface of the sealing member facing the organic light emitting device and including pigments for selectively absorbing light; and a black matrix layer on the selective light absorbing layer corresponding to non-emission areas of the organic light emitting device.

13 Claims, 4 Drawing Sheets

ORGANIC LIGHT EMITTING DISPLAY DEVICE

CROSS-REFERENCE TO RELATED PATENT APPLICATION

This application claims priority to and the benefit of Korean Patent Application No. 10-2007-0021155, filed on Mar. 2, 2007, in the Korean Intellectual Property Office, the entire content of which is incorporated herein in by reference.

BACKGROUND OF THE INVENTION

1. Field of the Invention

The present invention relates to an organic light emitting display device.

2. Description of the Related Art

A recent trend of display apparatuses is for the display apparatuses to be thin and mobile. Among the display apparatuses, organic and inorganic light emitting display devices are emissive type display apparatuses that have wide viewing angle, high contrast, and short response time. Also, among organic and inorganic light emitting display devices, an organic light emitting display device (in which a light emitting layer is formed of an organic material) has high brightness, low driving voltage, short response time, and can be multi-colored.

An organic light emitting display device can be a flat panel display device that is formed to be lightweight and thin so that the flat panel display device can be mobile and used in an outdoor environment. However, when images are viewed in the outdoor environment, contrast and visibility of the images displayed on the flat panel display device may be reduced due to strong external light such as sunlight. Even in an indoor environment, the visibility of the images displayed on the flat panel display device may be reduced due to fluorescent lamps.

Therefore, in order to reduce (or protect against) the reduction of visibility of images due to external light, a film type polarized plate may be attached to the entire surface of a flat panel display device. In this way, the reflection of external light that enters into the flat panel display device is reduced (or prevented). As a result, brightness of the reflected external light is reduced, and thus, the reduction of visibility of images due to external light is reduced (or prevented).

However, in the case of a conventional flat panel display device, the film type polarized plate attached to the entire surface of the flat panel display device is manufactured by bonding many layers of films. Thus, the manufacturing process is complicated, which leads to high manufacturing costs and increase in thickness of the flat panel display device. As such, a thin flat panel display device may not be realized. Accordingly, there is a need to develop a method to increase contrast of the organic light emitting display device without using a film type polarized plate (or a circular polarized film) and also to protect (or prevent) the organic light emitting display device from being damaged by external impact.

SUMMARY OF THE INVENTION

An aspect of an embodiment of the present invention is directed toward an organic light emitting display device that has an increased contrast and impact resistance.

An embodiment of the present invention provides an organic light emitting display device including: a substrate; a sealing member; an organic light emitting device between the substrate and the sealing member and for displaying images; a selective light absorbing layer on a surface of the sealing member facing the organic light emitting device and including pigments for selectively absorbing light; and a black matrix layer on the selective light absorbing layer corresponding to non-emission areas of the organic light emitting device.

The organic light emitting device may further include a first electrode, a pixel define layer on the first electrode and having an opening for exposing the first electrode, an organic light emitting layer on the first electrode exposed by the opening, and a second electrode on the organic light emitting layer, wherein the black matrix layer is on the selective light absorbing layer and corresponding to the pixel define layer of the organic light emitting device.

The selective light absorbing layer may include a red pigment and a blue pigment.

The selective light absorbing layer may have an optical transmittance ranging from about 10 to about 90% at a wavelength of about 550 nm.

The black matrix layer may have a thickness ranging from about 5 to about 20 μm.

The black matrix layer may include a material selected from the group consisting of carbon black particles and graphite.

The organic light emitting display may further include a reflection preventive layer on at least one surface of the sealing member.

The reflection preventive layer may include: a semi-transparent film for transmitting a portion of an external light and for reflecting another portion of the external light, and a protective film covering the semi-transparent film, wherein the semi-transparent film has a refractive index greater than that of the protective film.

The protective film may include a thermosetting resin.

The protective film may include a material selected from the group consisting of urethane acrylate and epoxy resin.

The semi-transparent film may have an optical transmittance ranging from about 40 to about 80%.

The semi-transparent film may have a refractive index ranging from about 1.5 to about 5.

The semi-transparent film may be a metal colloid.

The semi-transparent film may include a material selected from the group consisting of Au, Ag, and Ti.

Another embodiment of the present invention provides an organic light emitting display device including: a substrate; a sealing member; an organic light emitting device between the substrate and the sealing member and for displaying images; a black matrix layer on a surface of the sealing member facing the organic light emitting device and corresponding to non-emission areas of the organic light emitting device; and a selective light absorbing layer covering the black matrix layer and on a surface of the sealing member facing the organic light emitting device, and including pigments for selectively absorbing light.

The organic light emitting device may further include: a first electrode, a pixel define layer on the first electrode and having an opening for exposing the first electrode, an organic light emitting layer on the first electrode exposed by the opening, and a second electrode on the organic light emitting layer, wherein the black matrix layer is on the surface of the sealing member facing the organic light emitting device and corresponding to the pixel define layer of the organic light emitting device.

The organic light emitting display device may further include a reflection preventive layer on at least one surface of the sealing member.

Another embodiment of the present invention provides an organic light emitting display device including: a substrate; a sealing member; an organic light emitting device between the substrate and the sealing member and for displaying images; at least two black matrix layers on a surface of the sealing member facing the organic light emitting device and corresponding to non-emission areas of the organic light emitting device; and a selective light absorbing layer on the surface of the sealing member facing the organic light emitting device and between the at least two black matrix layers, and including pigments for selectively absorbing light.

The organic light emitting device may further include: a first electrode, a pixel define layer on the first electrode and having an opening for exposing the first electrode, an organic light emitting layer on the first electrode exposed by the opening, and a second electrode on the organic light emitting layer, wherein the at least two black matrix layers are formed on the surface of the sealing member facing the organic light emitting device and corresponding to the pixel define layer of the organic light emitting device.

The organic light emitting display device may further include a reflection preventive layer on at least one surface of the sealing member.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween.

Figure 1:
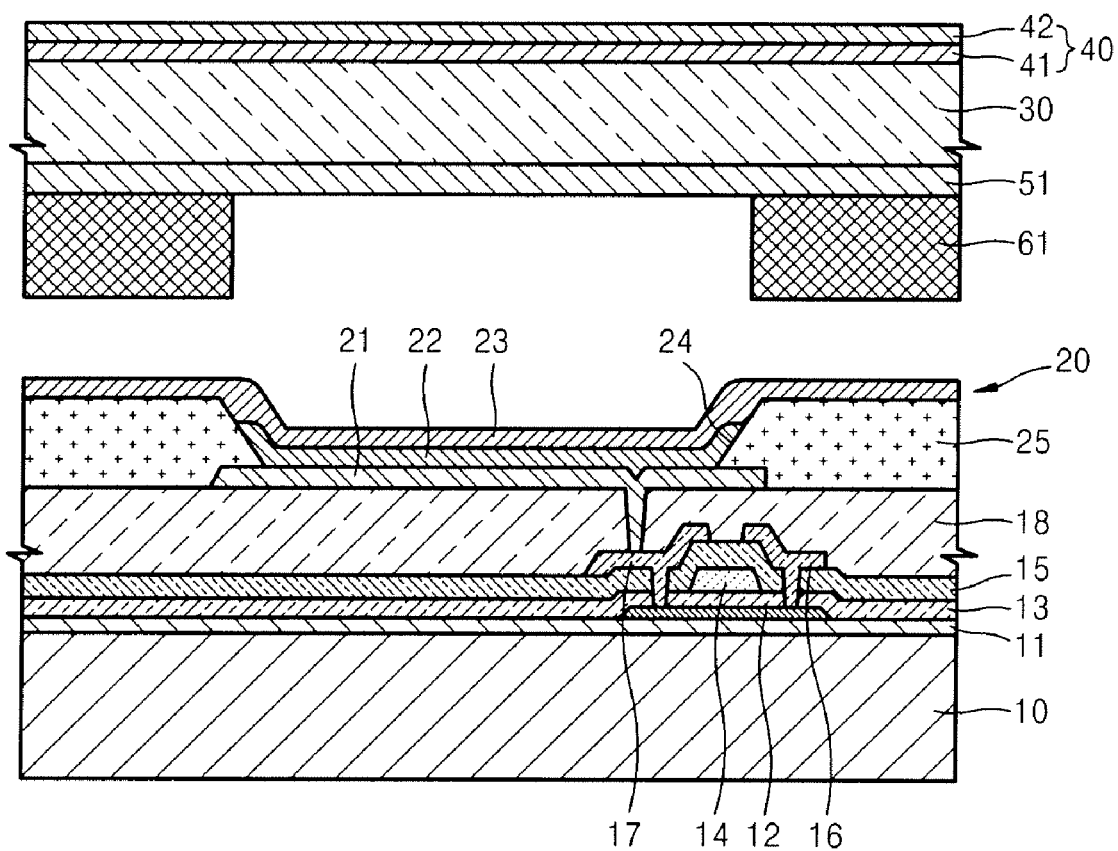
FIG. 1 is a schematic cross-sectional view illustrating an organic light emitting display device according to an embodiment of the present invention.

FIG. 1 is a schematic cross-sectional view illustrating an organic light emitting display device according to an embodiment of the present invention.

Organic light emitting display devices can largely be divided into active matrix (AM) type organic light emitting display devices and passive matrix (PM) type organic light emitting display devices. In FIG. 1, an AM type organic light emitting display device is shown. However, the present invention is not limited thereto, that is, the present invention can be applied to PM type organic light emitting display devices.

In FIG. 1, the organic light emitting display device is shown to include a substrate 10, an organic light emitting device 20, a sealing member 30, a reflection preventive film 40, a selective light absorbing layer 51, and a black matrix layer 61.

The substrate 10 can be formed of a transparent glass material that contains $SiO_2$ as a main component. However, the substrate 10 is not limited thereto, and can be formed of a transparent plastic material. In the case of a bottom emission type organic light emitting display device in which images are displayed by emitting light through the substrate 10, the substrate 10 should be formed of a transparent material. However, as depicted in FIG. 1, in the case of a top emission type organic light emitting display device in which images are displayed by emitting light through the sealing member 30, it is not necessary for the substrate 10 to be formed of a transparent material.

A buffer layer 11 can further be formed on the substrate 10 to be planar with the substrate 10 and to prevent (or protect from) the penetration of impure elements using $SiO_2$ and/or SiNx.

A thin film transistor (TFT) is formed on an upper side of the substrate 10. At least one TFT is formed in each pixel, and is electrically connected to the organic light emitting device 20.

A semiconductor layer 12 is formed in a pattern that may be predetermined on the buffer layer 11. The semiconductor layer 12 can be formed of an inorganic semiconductor such as amorphous silicon or poly silicon or be formed of an organic semiconductor, and includes a source region, a drain region, and a channel region.

A gate insulating film 13 is formed on the semiconductor layer 12 using $SiO_2$ or SiNx, and a gate electrode 14 is formed in a region (or a predetermined region) of the gate insulating film 13. The gate electrode 14 is connected to a gate line that applies ON/OFF signals to the TFT.

An interlayer insulating layer 15 is formed on the resultant structure to cover the gate electrode 14. A source electrode 16 and a drain electrode 17 are respectively connected to the source region and the drain region of the semiconductor layer 12. Here, the TFT is also shown to be covered by a passivation film 18.

The passivation film 18 can be an inorganic insulating film and/or an organic insulating film. The inorganic insulating film can be formed of $SiO_2$, SiNx, SiON, $Al_2O_3$, $TiO_2$, $Ta_2O_5$, $HfO_2$, $ZrO_2$, BST, or PZT, and the organic insulating film can be formed of an ordinary polymer such as poly methylmethacrylate (PMMA) or a polystyrene copolymer that includes polystyrene (PS), a polymer derivative having phenol group, an acryl group polymer, an imide group polymer, an ether group polymer, an amide group polymer, a fluoride group polymer, a p-gilyrene group polymer, a vinyl alcohol group polymer, or a blend of these materials. In one embodiment, the passivation film 18 can be formed as a composite stack of an inorganic insulating film and an organic insulating film.

A first electrode 21 that acts as an anode electrode of the organic light emitting device 20 is formed on the passivation film 18. A pixel define layer 25 is also shown to cover the first electrode 21, and is formed using an insulating material.

After an opening (or a predetermined opening) 24 is formed in the pixel define layer 25, an organic light emitting layer 22 of the organic light emitting device 20 is formed in a region defined by the opening 24. Afterwards, a second electrode 23 that acts as a cathode electrode of the organic light emitting device 20 is formed to cover all pixels. The polarity of the first electrode 21 and the second electrode 23 may be reversed.

The organic light emitting device 20 displays images using light generated according to the flow of current, and includes the first electrode 21 (electrically connected to the drain electrode 17 of the TFT through a contact hole), the organic light emitting layer 22, and the second electrode 23.

The first electrode 21 can be formed in a pattern that may be predetermined using a photolithography method. In the case of a PM type organic light emitting display device, the pattern of the first electrode 21 can be a plurality of stripes extending in a first direction and separated a distance that may be predetermined from each other. In the case of an AM type organic light emitting display device, the first electrode 21 can be formed in a shape corresponding to the pixels.

The second electrode 23 is formed above the first electrode 21, and can act as the cathode electrode by being connected to an external terminal. In the case of a PM type organic light emitting display device, the second electrode 23 can be formed into a plurality of stripes extending in a second direction crossing (e.g., perpendicularly crossing) the first direction of the stripe pattern of the first electrode 21. In the case of an AM type organic light emitting display device, the second electrode 23 can be formed over the entire active region where images are to be displayed. The polarity of the first electrode 21 and the second electrode 23 may be reversed.

In the case of a bottom emission type organic light emitting display device in which images are displayed through the substrate 10, the first electrode 21 can be a transparent electrode and the second electrode 23 can be a reflection electrode. In such case, the first electrode 21 can be formed of a material having high work function (such as ITO, IZO, ZnO, or $In_2O_3$), and the second electrode 23 can be formed of a metal having low work function (such as Ag, Mg, Al, Pt, Pd, Au, Ni, Nd, Ir, Cr, Li, or Ca).

As depicted in FIG. 1, in the case of a top emission type organic light emitting display device in which images are displayed through the second electrode 23, the first electrode 21 can be a reflection electrode and the second electrode 23 can be a transparent electrode.

In the case of FIG. 1, the reflection electrode that acts as the first electrode 21 can be formed such that, after a reflection film is formed using a metal such as Ag, Mg, Al, Pt, Pd, Au, Ni, Nd, Ir, Cr, Li, Ca, or a compound of these metals, a material having a high work function such as ITO, IZO, ZnO, or $In_2O_3$ is deposited on the reflection film. The transparent electrode that acts as the second electrode 23 can be formed such that, after depositing a metal having a low work function such as Ag, Mg, Al, Pt, Pd, Au, Ni, Nd, Ir, Cr, Li, Ca, or a compound of these metals, an auxiliary electrode layer or a bus electrode line can be formed on the metal deposition using a transparent conductive material such as ITO, IZO, ZnO, or $In_2O_3$.

In the case of a dual sided emission type organic light emitting display device, both of the first electrode 21 and the second electrode 23 can be formed to be transparent electrodes.

The organic light emitting layer 22 interposed between the first electrode 21 and the second electrode 23 emits light as a result of electrical driving of the first electrode 21 and the second electrode 23. The organic light emitting layer 22 can be formed of a low molecular weight organic material or a polymer organic material.

If the organic light emitting layer 22 is formed of a low molecular weight organic material, a hole transport layer (HTL) and a hole injection layer (HIL) are stacked in a direction from the organic light emitting layer 22 towards the first electrode 21, and an electron transport layer (ETL) and an electron injection layer (EIL) are stacked in a direction from the organic light emitting layer 22 towards the second electrode 23. Beside the above, various other suitable layers can be stacked with the light emitting layer 22, if necessary. The organic light emitting layer 22 can be formed of various materials including copper phthalocyanine (CuPc), N,N'-Di (naphthalene-1-yl)-N,N'-diphenyl-benzidine (NPB), and tris-8-hydroxyquinoline aluminium (Alq3).

If the organic light emitting layer 22 is formed of a polymer organic material, only an HTL is included in a direction from the organic light emitting layer 22 towards the first electrode 21. The HTL is formed on the first electrode 21 using poly-(2,4)-ethylene-dihydroxy thiophene (PEDOT) and/or polyaniline (PANI) by an inkjet printing method or a spin coating method. The polymer organic light emitting layer 22 can be formed of poly-phenylenevinylene (PPV), soluble PPV's, cyano-PPV, and/or polyfluorene, and a color pattern of the polymer organic light emitting layer 22 can be formed using a spin coating, an inkjet printing, and/or a thermal transcribing method.

The sealing member 30 that encapsulates the organic light emitting device 20 is formed on the organic light emitting device 20. The sealing member 30 protects the organic light emitting device 20 from external moisture and/or oxygen. In a top emission type organic light emitting display device as depicted in FIG. 1, the sealing member 30 is formed of a transparent material such as glass or plastic.

Here, in FIG. 1, the reflection preventive film 40 is composed of a semi-transparent film 41 and a protective film 42.

The semi-transparent film 41 that reflects some external light and transmits the rest of the external light is formed above the sealing member 30. The semi-transparent film 41 may have a refractive index ranging from about 1.5 to about 5 (or from 1.5 to 5).

The semi-transparent film 41 can be formed in a metal colloid shape (or as a metal colloid) using Ag, Au, or Ti. The semi-transparent film 41 can be readily formed through an annealing process after coating a film using a dip coating and/or a bar coating.

The semi-transparent film 41 can be formed to have an optical transmittance ranging from about 40 to about 80% (or from 40 to 80%) by controlling a thickness of the semi-transparent film 41 or by controlling process conditions for forming the metal colloid.

The semi-transparent film 41 can be formed to a thickness ranging from 10 nm to 10 μm. In one embodiment, if the semi-transparent film 41 is thicker than 10 μm, the transmittance of the semi-transparent film 41 is reduced resulting in the reduction of optical efficiency of light generated from the organic light emitting device 20, and thus, the semi-transparent film 41 is formed to a thickness of 10 μm or less.

In another embodiment, if the semi-transparent film 41 is thinner than 10 nm, the transmittance of the semi-transparent film 41 excessively increases. Accordingly, an amount of external light that passes through the semi-transparent film 41 increases, and thus, the reflection of external light increases.

The protective film 42 having a refractive index smaller than that of the semi-transparent film 41 is formed on the semi-transparent film 41.

The protective film 42 can be formed of a thermosetting resin having high impact resistance, such as urethane acrylate or epoxy resin. The protective film 42 is transparent. The protective film 42 can be formed such that, after coating a film by using a spin coating method, a dip coating method, or a bar coating method, the film is annealed or hardened by ultraviolet (UV) rays.

The protective film 42 can be formed to a thickness ranging from 10 nm to 30 μm. In one embodiment, in order to ensure impact resistance, the protective film 42 is formed to a thickness of 10 nm or more.

However, in another embodiment, if the thickness of the protective film 42 is excessively thick, an overall thickness of the organic light emitting display device increases. Therefore, the protective film 42 is formed to a thickness of 30 μm or less.

The protective film 42 is formed of a thermosetting resin having high impact resistance to prevent (or protect) the semi-transparent film 41 from external impact.

In FIG. 1, since the semi-transparent film 41 covers the protective film 42 on the sealing member 30, and the semi-transparent film 41 has a refractive index greater than that of the protective film 42, interfacial reflection of external light can be prevented (or reduced). Accordingly, a combination of the semi-transparent film 41 and the protective film 42 can perform the function of a conventional circular polarized plate. In particular, since the transmittance of the semi-transparent film 41 ranges from about 40 to about 80% (or from 40 to 80%), and the protective film 42 is transparent, transmittance similar to that of the conventional circular polarized film can be realized using the combination of the semi-transparent film 41 and the protective film 42.

In addition, the selective light absorbing layer 51 that includes pigments that selectively absorb light is formed on a surface of the sealing member 30 that faces the organic light emitting device 20.

Figure 2:
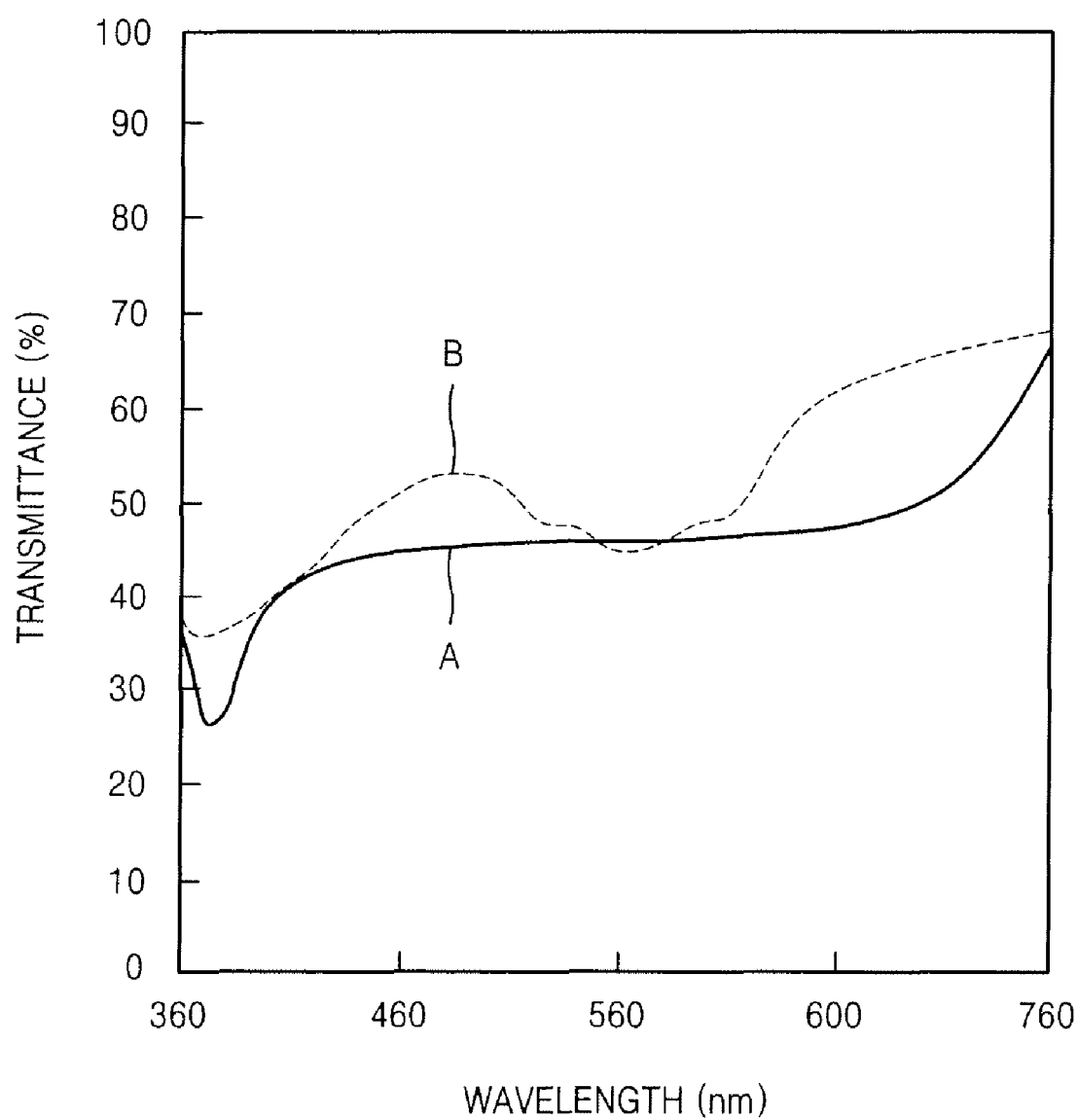
FIG. 2 is a graph showing an optical transmittance of a conventional circular polarized film in each wavelength and an optical transmittance of a selective light absorbing layer that includes blue and red pigments according to an embodiment of the present invention.

FIG. 2 is a graph showing an optical transmittance (curve A) of a conventional circular polarized film with respect to wavelength and an optical transmittance (curve B) of the selective light absorbing layer 51 with respect to wavelength that includes blue and red pigments according to an embodiment of the present invention.

Referring to curve A, the organic light emitting display device on which a conventional circular polarized film is attached shows an optical transmittance of about 45% in the visible light range.

However, referring to curve B, the organic light emitting display device on which the selective light absorbing layer 51 is attached shows that, in a particular wavelength region, for example, in a wavelength near 550 nm (a green light wavelength region), the optical transmittance is a lower than the optical transmittance in a wavelength of approximately 450 nm (a blue light wavelength region) and the optical transmittance in a wavelength of approximately 650 nm (a red light wavelength region).

The selective light absorbing layer 51 is formed such that, after 2 wt % $CoOAl_2O_3$ (cobalt blue) as a blue pigment and 0.2 wt % $Fe_2O_3$ are dispersed in a binder resin, the resultant product is coated to a thickness ranging from about 4 to about 5 μm (or from 4 to 5 μm) on the sealing member 30, and afterwards, the coating is hardened using UV rays.

The selective light absorbing layer 51 made of a red pigment and a blue pigment selectively transmits light in a red light wavelength region and a blue light wavelength region, but selectively absorbs the light in a green light wavelength region. That is, the optical transmittance in the green light wavelength region, which has high brightness, and thus, affects contrast the most, is reduced, thereby effectively reducing reflection of external light by the flat panel display device.

The present invention is not limited thereto, that is, the selective light absorbing layer 51 can be formed by combinations of various pigments having an optical transmittance ranging from about 10 to about 90% (or from 10 to 90%) in the green light wavelength region, that is, in a wavelength of about 550 nm.

A desired optical transmittance of the selective light absorbing layer 51 can be obtained by controlling the thickness of the selective light absorbing layer 51. That is, in order to increase the optical transmittance, the thickness of the selective light absorbing layer 51 is decreased, and to reduce the optical transmittance, the thickness is increased. Also, the thickness of the selective light absorbing layer 51 can be controlled in consideration of the optical transmittances of the semi-transparent film 41 and the protective film 42.

In particular, when the optical transmittances of the semi-transparent film 41 and the protective film 42 are taken into consideration, an overall optical transmittance of the organic light emitting display device can be controlled to be from about 40 to about 60% (or from 40 to 60%) because the selective light absorbing layer 51, the semi-transparent film 41, and the protective film 42 are used together and because the selective light absorbing layer 51 has an optical transmittance ranging from about 10 to about 90% (or from 10 to 90%) in a wavelength region of 550 nm. Therefore, although the selective light absorbing layer 51, the semi-transparent film 41, and the protective film 42 are used together, the effect of preventing external light and increasing contrast can be obtained by realizing an optical transmittance of about 40%, which is substantially the same as, or higher than, the optical transmittance of a conventional circular polarized plate.

Also, the black matrix layer 61 is formed on a surface of the selective light absorbing layer 51 opposite to the surface that faces the sealing member 30.

The black matrix layer 61 is patterned to be disposed in non-emission areas of the organic light emitting device 20. An emission area of the organic light emitting device 20 is an area where the organic light emitting layer 22 is formed, and the non-emission areas are the remaining areas of the organic light emitting device 20 other than the emission area. In the present embodiment, the organic light emitting layer 22 is formed in the opening 24 of the pixel define layer 25 that exposes a portion of the first electrode 21 so that the first electrode 21 is opened and has a step difference. The black matrix layer or black matrix layers 61 are disposed on locations of the selective light absorbing layer 51 corresponding to the pixel define layer 25.

The black matrix layer 61 is formed to a thickness ranging from about 5 to about 20 μm (or from 5 to 20 μm). The thick black matrix layer 61 formed on the selective light absorbing layer 51 corresponding to the non-emission areas of the organic light emitting device 20 effectively blocks (or prevents) external light reflection by the emission area of the organic light emitting device 20. That is, when external light reflected by metal electrodes formed in the emission area progresses in a direction in which light is extracted (towards the sealing member 30), the external light is absorbed by the black matrix layer 61 protruded from the sealing member 30.

When the black matrix layer 61 is formed to be thick, the absorption of external light can be increased. Also, a pixel unit can be protected from external impact by forming a gap (or a predetermined gap) between the sealing member 30 and the pixel unit of the organic light emitting device 20. That is, the black matrix layer 61 acts as a spacer formed in a conventional pixel define layer to protect the pixel unit from being damaged by external impact. Accordingly, a mask process performed to form the spacers on the pixel define layer can be omitted, thereby simplifying the manufacturing process.

Table 1 summarizes contrasts between organic light emitting display devices in which the conditions of the black matrix layer, the selective light absorbing layer, and the reflection preventive film are changed. The contrasts were evaluated by measuring reflection brightness when the external light was turned on and off using a NISTIR 6738 method under an external light of 150 lux atmosphere after white brightness was set at 100 cd/m².

TABLE 1

| Specimen No. | Conditions | Contrast |
| --- | --- | --- |
| 1 | Bare cell + BM(1 μm) | 18,613 |
| 2 | Bare cell + BM(10 μm) | 22,336 |
| 3 | Bare cell + BM(1 μm) + reflection preventive film + selective light absorbing layer | 62,347 |
| 4 | Bare cell + BM(10 μm) + reflection preventive film + selective light absorbing layer | 77,058 |
| 5 | Bare cell + circular polarized film | 76,538 |

The contrast of specimen 1 was measured under the conditions described above after the black matrix layer 61 having a thickness of 1 μm was spin coated on the sealing member 30, and patterned. The contrast of specimen 2 was measured under the conditions described above after the black matrix layer 61 having a thickness of 10 μm was spin coated and patterned on the sealing member 30. When the contrasts of specimen 1 and specimen 2 are compared specimen 2 shows increased contrast by approximately 20%.

Also, the contrast of specimen 3 was measured under the conditions described above after the black matrix layer 61 having a thickness of 1 μm was spin coated on the sealing member 30 on which the reflection preventive film 40 and the selective light absorbing layer 51 were formed by patterning. The contrast of specimen 4 was measured under the conditions described above after the black matrix layer 61 having a thickness of 10 μm was spin coated and patterned on the sealing member 30 on which the reflection preventive film 40 and the selective light absorbing layer 51 are formed. When the contrasts of specimen 3 and specimen 4 are compared, specimen 4 shows increased contrast by about 20% like in the case of specimen 1 and specimen 2. That is, according to the above result, when the thickness of the black matrix layer 61 formed on a surface of the sealing member 30 through which light is extracted is increased to be about 10 μm, contrast increases by about 20%.

Specimen 5 shows measured contrast of an organic light emitting device to which a conventional circular polarized film is attached. Specimen 4 shows a contrast which is a little higher than that of the specimen 5 in which a conventional circular polarized film is attached to the organic light emitting device. Accordingly, an organic light emitting display device having a contrast equal to, or higher than, the contrast of an organic light emitting display device having a conventional circular polarized film can be realized by appropriately controlling the thickness of the black matrix layer 61, the thickness of the selective light absorbing layer 51, and/or selection of pigments included in the selective light absorbing layer 51, and/or the refractive index and/or thickness of the reflection preventive film 40.

Here, the thickness of the black matrix layer 61 may not exceed 20 μm for the realization of a thin organic light emitting display device. Also, as described above, the thickness of the black matrix layer 61 may have a thickness of at least 5 μm in order to perform the function of spacers. Also, the black matrix layer 61 can be formed of an organic material composed of carbon black particles, a binder resin, and an optical initiator, or can be a graphite film formed by using an inorganic vacuum deposition method. However, the black matrix layer 61 according to an embodiment of the present invention is not limited thereto, that is, any suitable material that can absorb external light can be used for forming the black matrix layer 61.

As described above, the organic light emitting display device can increase contrast because the selective light absorbing layer 51 (that includes pigments that selectively absorb light) and the black matrix layer 61 are included on the sealing member 30. Also, the protective film 42 having a high impact resistance is formed on the surface of the sealing member 30, and thus, an outer surface of the organic light emitting display device can be protected from external impact. Also, the black matrix layer 61 that is relatively thick is employed on a surface of the selective light absorbing layer 51, and thus, pixel units of the organic light emitting display device can be protected from external impact.

Organic light emitting display devices according to other embodiments of the present invention will now be described with reference to FIGS. 3 and 4. Hereinafter, features different from the embodiment described with reference to FIG. 1 will be described in more detail, and like numerals refer to like elements.

Figure 3:
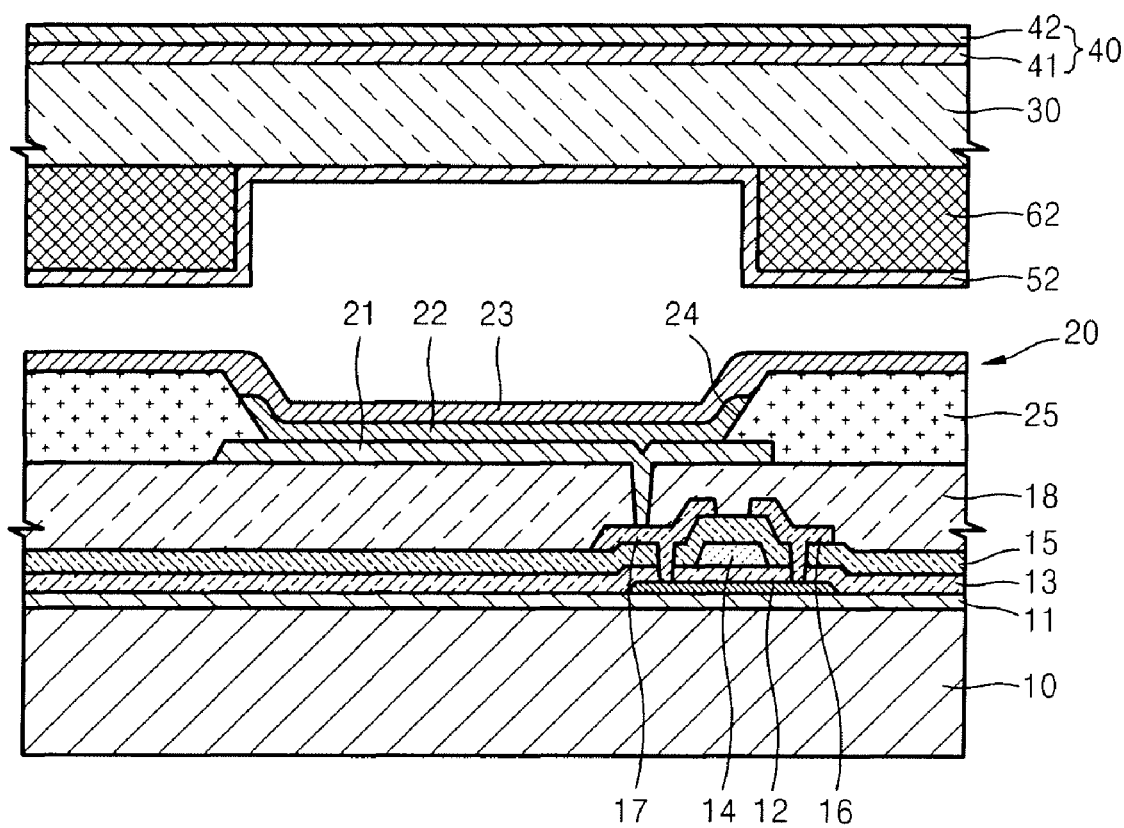
FIG. 3 is a schematic cross-sectional view illustrating an organic light emitting display device according to another embodiment of the present invention.

Referring to FIG. 3, the organic light emitting display device includes a substrate 10, an organic light emitting device 20, a sealing member 30, a reflection preventive film 40, a selective light absorbing layer 52, and a black matrix layer 62.

The organic light emitting device 20 formed on the substrate 10 includes a first electrode 21, a pixel define layer 25 in which an opening 24 is formed to expose the first electrode 21, an organic light emitting layer 22 formed on the first electrode 21 on which the opening 24 is formed, and a second electrode 23 formed on the organic light emitting layer 22.

The sealing member 30 is formed above the organic light emitting device 20 and the reflection preventive layer 40 is formed on the surface of the sealing member 30 that faces oppositely away from the organic light emitting device 20. The reflection preventive layer 40 includes a semi-transparent film 41 that transmits some external light and reflects the rest of the external light and a protective film 42 having a refractive index less than that of the semi-transparent film 41 and covering the semi-transparent film 41 (i.e., the semi-transparent film 41 is between the sealing member 30 and the protective film 42).

The black matrix layer 62 is formed on an area of surfaces of the sealing member 30 that faces the organic light emitting device 20 corresponding to the pixel define layer 25 of the organic light emitting device 20. The selective light absorbing layer 52 that includes pigments that selectively absorb light is formed on a surface of the black matrix layer 62 facing the organic light emitting device 20 to cover the black matrix layer (or layers) 62.

Figure 4:
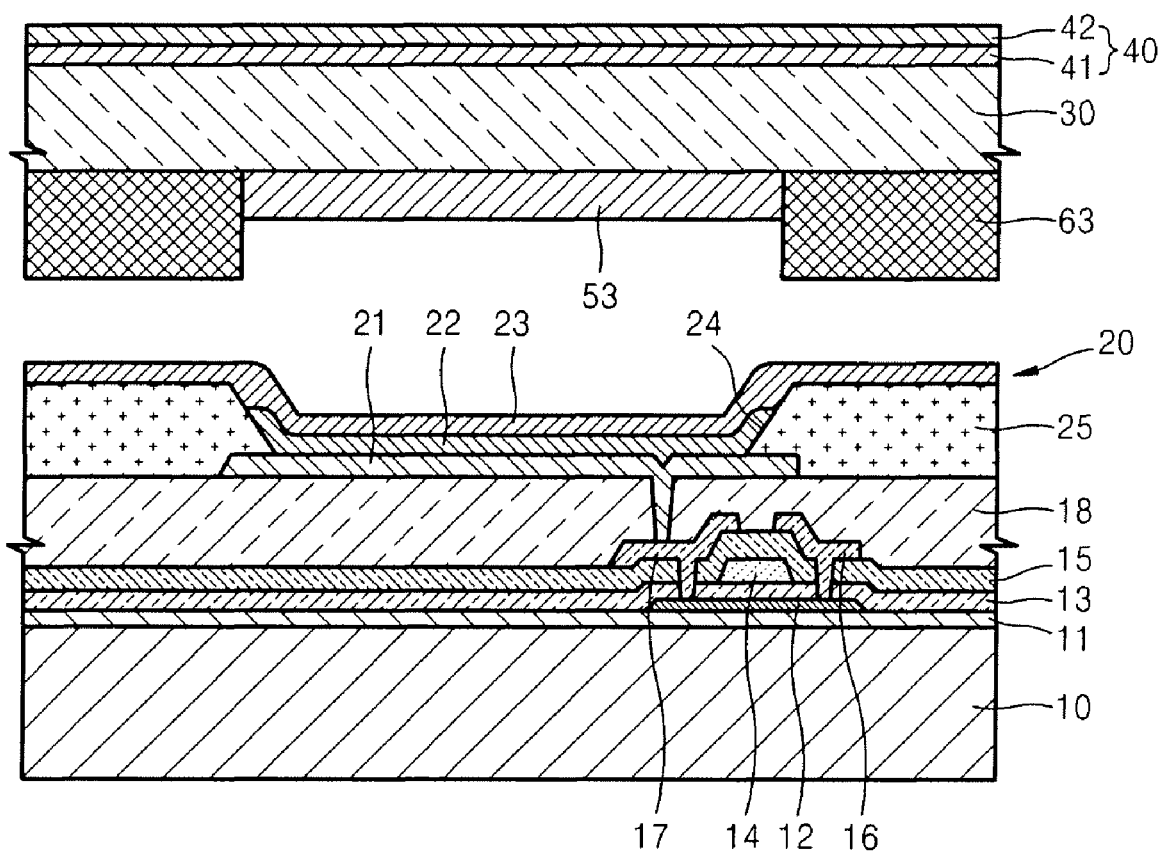
FIG. 4 is a schematic cross-sectional view illustrating an organic light emitting display device according to another embodiment of the present invention.

Referring to FIG. 4, the organic light emitting display device includes a substrate 10, an organic light emitting device 20, a sealing member 30, a reflection preventive layer 40, a selective light absorbing layer 53, and black matrix layer (or layers) 63.

The organic light emitting device 20 formed on the substrate 10 includes a first electrode 21, a pixel define layer 25 in which an opening 24 is formed to expose the first electrode 21, an organic light emitting layer 22 formed on the first electrode 21 on which the opening 24 is formed, and a second electrode 23 formed on the organic light emitting layer 22.

The sealing member 30 is formed above the organic light emitting device 20, and the reflection preventive layer 40 is formed on the surface of the sealing member 30 that faces oppositely away from the organic light emitting device 20. The reflection preventive layer 40 includes a semi-transparent film 41 that transmits some external light and reflects the rest of the external light and a protective film 42 having a refractive index less than that of the semi-transparent film 41 and covering the semi-transparent film 41.

The black matrix layer 63 is formed on an area of the surface of the sealing member 30 that faces the organic light emitting device 20 corresponding to the pixel define layer 25 of the organic light emitting device 20. The selective light absorbing layer 53 that includes pigments that selectively absorb light is formed on areas of the surface of the sealing member 30 that face the organic light emitting device 20, and is between the black matrix layers 63. In the above structure, the pigments included in the selective light absorbing layer 53 can be arranged in various combinations corresponding to each of pixels that emit red, green, and blue light, thereby further increasing the quality of the organic light emitting display device.

As described above, an organic light emitting display device according to an embodiment can increase contrast because a selective light absorbing layer (e.g., layer 52, 53) that includes pigments that selectively absorb light and a black matrix layer (e.g., layer 62 and 63) are included on a sealing member (e.g., member 30). Also, a protective film (e.g., film 42) having a high impact resistance is formed on a surface of the sealing member, and thus, an outer surface of the organic light emitting display device can be protected from external impact. Also, thick black matrix layer or layers (e.g., layer(s) 62, 63) are employed on a surface of the selective light absorbing layer (e.g., layer 52, 53), and thus, pixel units of the organic light emitting display device can be protected from external impact.

As such, in view of the foregoing, an organic light emitting display device according to an embodiment of the present invention can increase contrast.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device comprising:
    a substrate;
    a sealing member;
    an organic light emitting device between the substrate and the sealing member and for displaying images;
    a selective light absorbing layer on a surface of the sealing member facing the organic light emitting device and comprising pigments for selectively absorbing light;
    a reflection preventive layer on at least one surface of the sealing member; and
    a black matrix layer on the selective light absorbing layer and corresponding to non-emission areas of the organic light emitting device.

2. The organic light emitting display device of claim 1, wherein the organic light emitting device comprises:
    a first electrode,
    a pixel define layer on the first electrode and having an opening for exposing the first electrode,
    an organic light emitting layer on the first electrode exposed by the opening, and
    a second electrode on the organic light emitting layer,
    wherein the black matrix layer is on the selective light absorbing layer and corresponding to the pixel define layer of the organic light emitting device.

3. The organic light emitting display device of claim 1, wherein the selective light absorbing layer comprises a red pigment and a blue pigment.

4. The organic light emitting display device of claim 1, wherein the selective light absorbing layer has an optical transmittance ranging from about 10 to about 90% at a wavelength of about 550 nm.

5. The organic light emitting display device of claim 1, wherein the black matrix layer has a thickness ranging from about 5 to about 20 µm.

6. The organic light emitting display device of claim 1, wherein the black matrix layer comprises a material selected from the group consisting of carbon black particles and graphite.

7. The organic light emitting display device of claim 1, wherein the reflection preventive layer comprises:
    a semi-transparent film for transmitting a portion of an external light and for reflecting another portion of the external light, and
    a protective film covering the semi-transparent film,
    wherein the semi-transparent film has a refractive index greater than that of the protective film.

8. The organic light emitting display device of claim 7, wherein the semi-transparent film comprises a material selected from the group consisting of Au, Ag, and Ti.

9. The organic light emitting display device of claim 7, wherein the protective film comprises a thermosetting resin.

10. The organic light emitting display device of claim 7, wherein the protective film comprises a material selected from the group consisting of urethane acrylate and epoxy resin.

11. The organic light emitting display device of claim 7, wherein the semi-transparent film has an optical transmittance ranging from about 40 to about 80%.

12. The organic light emitting display device of claim 7, wherein the semi-transparent film has a refractive index ranging from about 1.5 to about 5.

13. The organic light emitting display device of claim 7, wherein the semi-transparent film is a metal colloid.

* * * * *